United States Patent [19]
Hirschkoff

[11] Patent Number: 5,081,071
[45] Date of Patent: Jan. 14, 1992

[54] MAGNETICALLY SHIELDED ENCLOSURE

[75] Inventor: Eugene C. Hirschkoff, Leucadia, Calif.

[73] Assignee: Biomagnetic Technologies, Inc., San Diego, Calif.

[21] Appl. No.: 178,064

[22] Filed: Apr. 5, 1988

[51] Int. Cl.$^5$ .............................................. H01B 12/00
[52] U.S. Cl. ...................................... 505/1; 128/653.1
[58] Field of Search ................... 128/653; 174/35 MS; 324/238; 505/872

[56] References Cited

U.S. PATENT DOCUMENTS

| | | | |
|---|---|---|---|
| Re. 32,689 | 6/1988 | Damailian | 128/653 |
| 3,557,777 | 1/1971 | Cohen | 128/653 |
| 3,608,280 | 9/1971 | Martin | 55/222 |
| 3,691,491 | 9/1972 | Massar et al. | 505/872 X |
| 3,745,226 | 7/1973 | Nichols et al. | 174/35 MS |
| 4,221,834 | 9/1980 | Opfer et al. | 505/872 X |
| 4,324,255 | 4/1982 | Barach et al. | 128/653 X |
| 4,409,579 | 10/1983 | Clem et al. | 505/872 X |
| 4,490,675 | 12/1984 | Knuettel et al. | 324/319 |
| 4,551,678 | 11/1985 | Morgan et al. | 128/653 X |
| 4,613,820 | 9/1986 | Edelstein et al. | 505/872 X |
| 4,651,099 | 3/1987 | Vinegar et al. | 128/653 X |
| 4,677,251 | 6/1987 | Merewether | 174/35 MS |

FOREIGN PATENT DOCUMENTS 2137756  10/1984  United Kingdom ............. 128/653

*Primary Examiner*—Kyle L. Howell
*Assistant Examiner*—J. P. Lacyk
*Attorney, Agent, or Firm*—Gregory Garmong

[57] ABSTRACT

A magnetically shielded enclosure provides a shielded environment having very low, constant levels of magnetic and electrical signals resulting from external sources, so that the magnetic signals produced by the body of a person in the enclosure can be measured in the absence of outside interference. The walls of the enclosure include concentric layers of a superconducting material and a material that is electrically and thermally conductive, and the person and magnetic measurement apparatus are enclosed therein. The superconducting layer is preferably supported on, and in thermal contact with, the conductive layer, and is cooled to a temperature below its superconducting transition temperature by cooling the conductive layer. Optionally, a magnetic cancellation field is applied prior to transforming the superconducting material to the superconducting state or otherwise sealing the enclosure, to zero the internal magnetic field.

14 Claims, 3 Drawing Sheets

MAGNETICALLY SHIELDED ENCLOSURE

BACKGROUND OF THE INVENTION

This invention relates to an enclosure from which magnetic and electrical fields are excluded, and, more particularly, to such an enclosure constructed of superconducting materials.

The human body produces various kinds of energy that may be used to monitor the status and health of the body. Perhaps the best known of these types of energy is heat. Most healthy persons have a body temperature of about 98.6° F. A measured body temperature that is significantly higher usually indicates the presence of an infection or other deviation from normal good health. A simple medical instrument, the clinical thermometer, has long been available to measure body temperature.

Over 100 years ago, medical researchers learned that the body also produces electrical signals. Doctors today can recognize certain patterns of electrical signals that are indicative of good health, and other patterns that indicate disease of abnormality. The best known types of electrical signals are those from the heart and from the brain, and instruments have been developed that measure such signals. The electrocardiograph measures electrical signals associated with the operation of the heart, and the electroencephalograph measures the electrical signals associated with the brain. Such instruments have now become relatively common, and most hospitals have facilities wherein the electrical signals from the bodies of patients can be measured to determine certain types of possible disease or abnormality.

More recently, medical researchers have discovered that the body produces magnetic fields of a type completely different than the other types of energy emitted from the body. The research on correlating magnetic fields with various states of health, disease and abnormality is underway, but sufficient information is available to demonstrate that certain emitted magnetic fields are associated with conditions such as epilepsy and Alzheimer's disease. Ongoing medical studies are investigating the nature of the normal and abnormal magnetic fields of the brain, and seeking to correlate those fields with the precise location in the brain from which they emanate. If it were known that a particular abnormality, such as Alzheimer's disease, were associated with an abnormal magnetic field produced at a particular location in the brain, it might be possible to detect the abnormality at an early stage, while it was treatable, and then apply other medical knowledge to treat that precise portion of the brain. Magnetic studies of the brain therefore offer the potential for understanding and treating some of the most crippling diseases and conditions known.

The biomagnetometer is an instrument that has been developed for measuring magnetic fields produced by the body, particularly the brain. The biomagnetometer is a larger, more complex instrument than the medical instruments mentioned earlier, primarily because the magnetic fields produced by the body are very small and difficult to measure. Typically, the strength of the magnetic field produced by the brain is about 0.00000001 Gauss. By comparison, the strength of the earth's magnetic field is about 0.5 Gauss, or over a million times larger than the strength of the magnetic field of the brain. Most electrical equipment also produces magnetic fields, in many cases much larger than that of the earth. It is apparent that, unless special precautions are taken, it is difficult or impossible to make magnetic measurements of the human body because the external influences such as the earth's magnetism and nearby apparatus can completely mask the magnetic fields from the body.

The biomagnetometer includes a very sensitive detector of magnetic signals. The currently most widely used detector is a Superconducting Quantum Interference Device or SQUID, which is sufficiently sensitive to detect magnetic signals produced by the brain. (See, for example, U.S. Pat. Nos. 4,386,361 and 4,403,189, whose disclosures are incorporated by reference, for descriptions of two types of SQUIDs.) This detector and its associated equipment require special operating conditions such as a cryogenic dewar, and cannot be placed into the body or attached directly to the surface of the body.

The present biomagnetometer usually includes a chair or table upon which the patient is positioned, and a structure which supports the SQUID in proximity with the head of the patient, as about 8 inches away. Special electronics are used to filter out external effects such as the earth's magnetic field and the magnetic fields of nearby electrical instruments. (For a description of such a device, see U.S. Pat. Nos. 3,980,076 and 4,079,730, whose disclosures are herein incorporated by reference.) The electronics filters out a portion of the external magnetic noise, but in some regimes is not entirely successful. The electronics is also costly and amount to a major portion of the cost of the system.

There is another possibility for reducing the adverse effect of the external magnetic field, which can be used in place of, or in addition to, the electrical signal processing. In this approach, the patient and detector are placed into a magnetically quiet enclosure that shields the patient and the detector from the external magnetic fields. The magnitude of the magnetic field within the enclosure is reduced from about 0.5 Gauss or more, to less than about 0.001 Gauss. With this reduction in the ambient magnetic field, the magnetic events of interest can be measured more readily, and the signal processing required to achieve usable information is greatly reduced.

Magnetically shielded enclosures have been known, as for example the design description in U.S. Pat. No. 3,557,777, whose disclosure is herein incorporated by reference. In this approach, concentric layers of a high permeability metal and a metallic conductor are supported on a frame. While operable, such enclosures are heavy and depend upon the use of expensive, high permeability metals that must be procured specially. The preparation of each such enclosure is therefore essentially a custom operation, requiring long lead times, and the enclosures are costly.

Accordingly, there exists a need for an improved magnetically shielded enclosure which has a low level of electromagnetic and magnetic noise in its interior, and which is less expensive to construct than existing enclosures. The present invention fulfills this need, and further provides related advantages.

SUMMARY OF THE INVENTION

The present invention provides a magnetically shielded enclosure that creates an internal environment having a stable magnetic field, and in which magnetic and electrical fields due to external sources are greatly reduced. Such an enclosure is particularly useful in making biomagnetic measurements of persons who are within the enclosure. The low, stable magnetic internal environment reduces the artifact in magnetic output due to vibration, and in long term changes in the external magnetic fields. The enclosure is substantially lighter in weight and less costly than prior enclosures used for this purpose, and can be manufactured more readily.

In accordance with the invention, apparatus for use in making magnetic measurements of a person comprises an enclosure of sufficient size to admit a person to the interior thereof, the walls of the enclosure including a layer of a thermally and electrically conductive metal, and a layer of a superconducting material having a superconducting transition temperature less than ambient temperature but greater than about 77° K.; means for cooling the superconducting material to a temperature below its critical temperature; and means for internally insulating the enclosure to prevent heat loss from the layer of superconducting material to the interior of the enclosure, so that the interior of said enclosure may be maintained at ambient temperature.

In accordance with another embodiment, apparatus for use in making magnetic measurements of a person, comprises an enclosure of sufficient size to admit a person to the interior thereof, the walls of the enclosure including a layer of a thermally and electrically conductive metal, and a layer of a superconducting material which is superconducting at ambient temperature.

External magnetic fields are excluded from the interior of the enclosure by the layer of superconducting material. The superconducting material is not required to carry a high current density, the basis for many other applications. Instead, the superconducting material is used because it generates surface electrical currents that precisely cancel an applied external magnetic field. As a result, the net magnetic field change inside an enclosure of a superconducting material is zero, resulting in a highly stable magnetic internal environment. It is not necessary that the superconducting material carry a large electrical current density while being maintained in the superconducting state, because of the large surface area of the enclosure.

The present invention utilizes a superconducting material whose superconducting transition temperature, $T_c$, is greater than the boiling point of liquid nitrogen, 77° K. (As used herein, the transition temperature $T_c$ is the highest temperature at which superconductivity occurs for a material, in the absence of an externally applied current or magnetic field.) The present invention provides an excellent application of advanced high-temperature superconductors, because the superconducting layer is not required to carry a large electrical current density or function in a high magnetic field, either of which could force the superconductor to become a normal non-superconductor.

· Those superconductors having transition temperatures less than about 77° K. are not suitable for use in the present invention, because all of the wall surfaces of a room-sized enclosure could not be practically cooled to such low temperatures by any known technology. The previously known low-temperature superconductors are operated within vacuum-insulated Dewar vessels cooled with a liquified gas such as liquid helium. Such a scheme would not practical economically as a mode of construction for a room-sized enclosure, and there is considerable doubt whether it would be technically feasible as a transition to normal conductivity of even a portion of the enclosure wall would defeat the purpose of the enclosure. Thus, the problem of creating a room-sized enclosure of a superconducting material is qualitatively different from that of creating small enclosures of such materials, and cannot be solved by the use of prior low-temperature superconductors.

In he most preferred form of the present invention, the high-temperature superconductor is deposited as a thin layer upon the layer of electrically conducting material, which is preferably copper or aluminum. The bi-layer material is fastened to a wooden frame by non-magnetic fasteners such as plastics. Care is taken to exclude all magnetic materials from the interior of the space defined by the layers of superconductor material and electrically conducting material.

Where the superconducting material has a transition temperature below ambient temperature, the superconducting material is cooled by a plurality of thermal conductors operating from an external heat sink at a temperature sufficiently below the superconducting transition temperature that the layer of superconducting material is also maintained at a temperature below its superconducting transition temperature. The conductors are preferably copper or aluminum tubes through which a coolant supplied from the heat sink is passed, or wires, cables, or lines contacting the heat sink at one end, and the layer of conducting metal at the other. A plurality of conductors extend to the conducting layer in this manner, so as to cool the entire structure to a temperature below the superconducting critical temperature of the superconducting layer, so that it remains in the superconducting state.

The described structure is well insulated, to prevent heat loss to the interior and exterior of the enclosure. The interior insulation is required so that the interior of the enclosure is maintained at a comfortable ambient temperature for the person therein. The interior and exterior insulation reduce the heat input to the superconducting layer that otherwise would drive the material to its normal state. The amount of cooling required from the heat sink is thereby reduced. The interior and exterior insulations are preferably conventional foam material that is attached to the support structure in large sheets, over the exterior surface of the layer of superconducting material and the interior of the layer of conducting material. A thickness of about 6 inches of foamed insulation on each side of the cooled parts is sufficient to reduce heat input to an acceptably low level. Once the walls of the enclosure have been cooled to the operating temperature, there is a low continuous level of heat extraction required to the heat sink, to maintain the enclosure at its operating temperature below the $T_c$ of the superconductor. If the superconducting material has a transition temperature of at least ambient temperature, the cooling means and the insulation are not required.

The enclosure of the invention includes a door through which a person may enter and leave the enclosure. The door is constructed using generally the same approach as just described, but is hinged or otherwise joined to the fixed portion of the structure so as to be openable, and is also made to seal with the fixed portion of the structure so as to resist the penetration of external magnetic flux through the space between the door and the fixed portion. Such a seal is accomplished by making the region between the door and the door jamb long, or by making the path that flux must travel to be tortuous.

For mot applications, there are provided electrical feedthroughs for instrumentation located within the enclosure. These feedthroughs must be constructed so as to avoid penetration of external magnetic flux lines and to avoid excessive transmission of heat. These ends are achieved by making the feedthroughs in the form of long tubes of a construction similar to that of the walls of the enclosure, with layers of a superconducting material and an electrically conducting material. The wires are passed into the interior of the enclosure through the tubes, and the size of the tube is not substantially greater than required for the wires. Insulation of higher performance than foam may be used for the interior of the feedthrough tube, so that the interior cross sectional size of the tubes may be made as small as possible. By making the feedthrough tube long or of a nonlinear, tortuous shape, external magnetic flux cannot penetrate into the interior of the enclosure along the interior of the feedthrough. Experience has shown that making the length of the tube about 10 times that of its internal diameter is sufficient to exclude external flux from the interior of the enclosure. Such a feedthrough construction can also be used for passing other things into the interior of the enclosure, such as, for example, a tube through which a liquid flows.

The enclosure of the invention operates to avoid changes in the internal magnetic field due to changes in the external or environmental magnetic field. To further improve the magnetic measurements, the enclosure and/or the magnetic measuring apparatus therein may be vibrationally isolated from the surroundings, by any of the techniques known in the art, such as isolating pads and fluid dampers.

Another approach to reducing the influence of magnetic fields other than those created within the enclosure and being measured is to provide coils to cancel the internal magnetic field prior to the activation of the superconducting material by cooling or closing the enclosure. That is, even when the enclosure is operating properly (but without using field cancellation coils), there is a residual internal magnetic field that was initially present before the door was closed or the superconducting material was transformed into the superconducting state. This residual internal magnetic field can sometimes be ignored, but if the measurement apparatus is subject to mechanical vibration of any sort, the vibration appears as noise in the output signal. If necessary, the residual internal magnetic field can be cancelled by providing field cancellation coils that nullify the environmental magnetic field prior to the time that the door is closed or the superconducting material is cooled to the superconducting state. Then, when the enclosure is sealed and the walls are made superconducting, the internal magnetic field is not only constant, but is constant at a low value. The field cancellation coils can then be turned off, as the superconducting structure resists further increase in the internal field.

As part of a biomagnetic measuring system, the enclosure is provided with the necessary sensors and detectors to convert magnetic signals within the enclosure to electrical signals that are recorded for analysis. In accordance with this aspect of the invention, apparatus for detection of biomagnetic activity of a person comprises a magnetically quiet enclosure having therein a level of magnetic noise less than about $10^{-5}$ Guass/Hertz[1], the enclosure including a shell and a doorway therethrough for admitting a person to the interior of the enclosure, the structure of the enclosure including concentric layers of a thermally and electrically conductive metal and a superconducting material; means for cooling the superconducting material to a temperature below its critical temperature; and means for performing measurements of biomagnetic activity of a person located within the enclosure. The preferred approaches, such as doorway and feedthrough construction and the use of field cancellation coils, described previously are applicable to this embodiment of the invention.

It will be appreciated that the present invention provides an important advance in the field of biomagnetic measurements. The enclosure of the invention achieves an internal environment that is virtually free of externally produced electrical and magnetic signals and is stable over extended periods of time. It is much more readily constructed than prior magnetically shielded rooms, and is lighter in weight. Other features and advantages of the invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
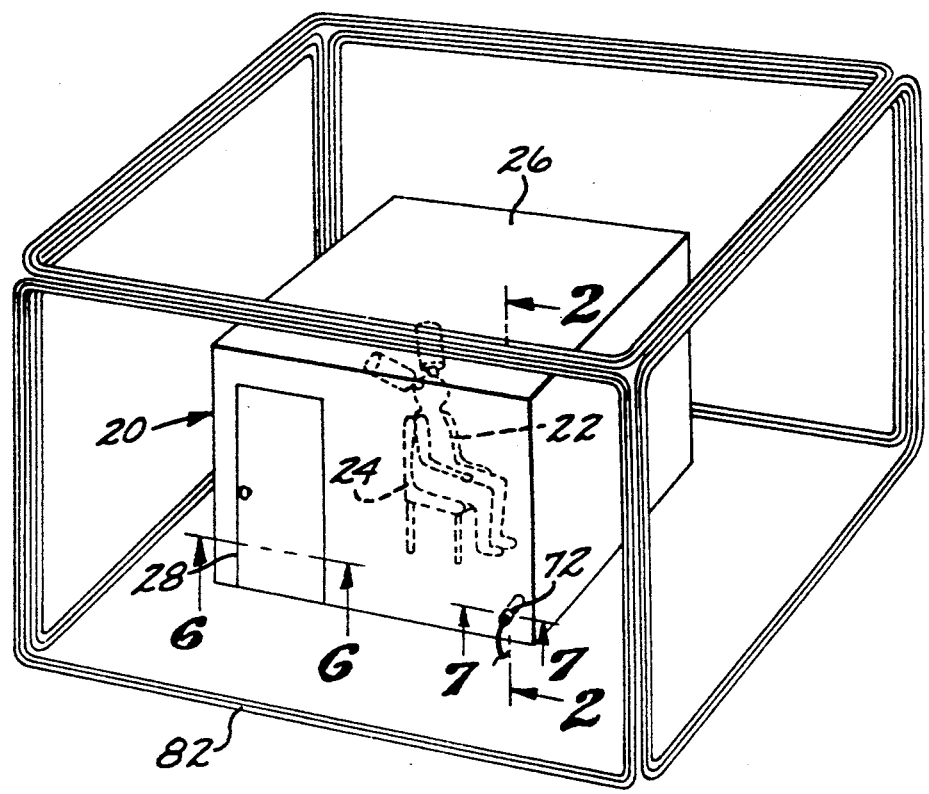
FIG. 1 is a perspective cutaway drawing of the enclosure of the invention.

FIG. 1 illustrates a preferred enclosure 20 used for performing biomagnetic measurements of a person 22 therein. In the illustrated embodiment, the person 22 sits in a chair 24, although alternatively the person 22 may lie in a bed. The inside dimensions of the enclosure 20 within walls 26 must be sufficiently large for this intended application. For example, the enclosure is typically in the form of a cube about 8 feet on a side, with a door 28 in one wall 26. As illustrated, four of the walls are sidewalls, one wall is the ceiling, and one wall is the floor of the enclosure 20. Since external magnetic and electrical fields must be excluded from the interior of the enclosure 20, each of the walls, as well as the door, must be constructed in a similar manner to exclude such fields. The description of the construction of one wall therefore applies to the other walls and the door.

The necessity of these relatively large dimension is significant in relation to the selection of the superconducting material used in the wall of the enclosure, and the method of cooling it. The large amount of wall area, typically at least about 400–500 square feet, would be virtually impossible to cool to a temperature below the superconducting critical temperature if conventional superconducting materials with low critical temperatures, and methods of cooling, were used.

Figure 2:
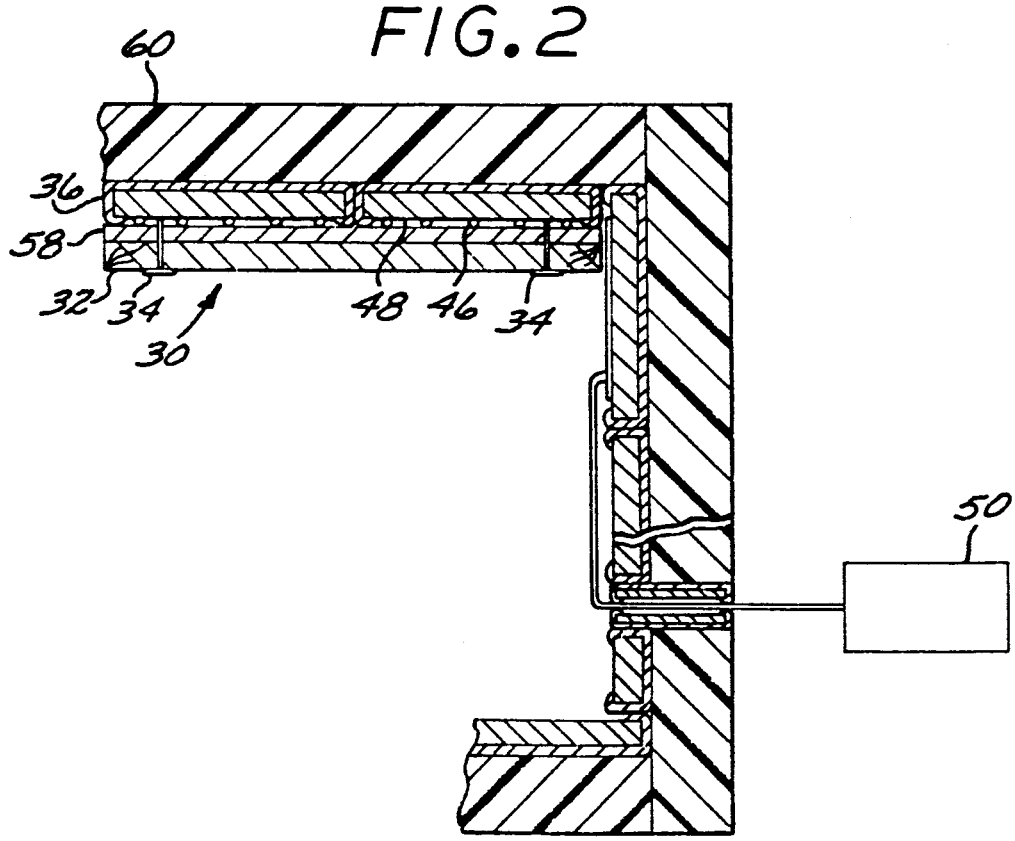
FIG. 2 is a sectional drawing of the wall construction of the enclosure of FIG. 1, taken along lines 2—2.

The construction of the wall 26 is illustrated in cross section in FIG. 2. The support structure 30 of the wall 26 is of wooden frame construction, including beams 32 of FIG. 2. Where connections are necessary between the beams 32, nonmetallic fasteners 34 such as nylon screws, or structural adhesives, are used. The structural loadings on the enclosure 20 are not large, because it is normally built inside a room of a hospital or research facility, and because the weight of the shielding is not great. Nonmetallic fasteners and adhesives are therefore satisfactory.

Figure 3:
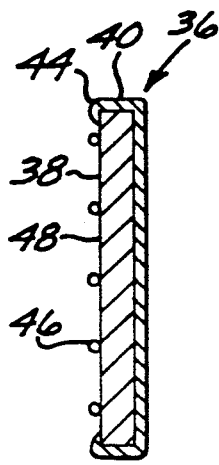
FIG. 3 is an enlargement of a detail of FIG. 2, illustrating the shielding material.

The shielding against external electrical and magnetic fields is preferably provided as prefabricated sheets of a composite shielding material 36 illustrated in FIGS. 2 and 3. The shielding material 36 includes a continuous layer 38 of an electrically and thermally conducting material that shields the interior of the enclosure 20 against external electrical fields, and is grounded so as to conduct electrical charges to ground. Unalloyed or lightly alloyed copper and aluminum sheet of a thickness of about 8-10 millimeters is acceptable. Unalloyed copper of aluminum has a desirably greater conductivity than alloyed material, but has a lower strength. The preferred material is pure copper of thickness 10 millimeters.

A layer 40 of a material that, in operation, is in the superconducting state is also provided. The best superconducting materials have zero electrical resistance and zero magnetic permeability, excluding magnetic flux lines from their interior by a phenomenon known as the Meissner effect. As used herein, these properties of electrical resistance and zero magnetic permeability indicate that external magnetic flux lines cannot penetrate to the interior of and through a superconductor. It is recognized that, in some theories of superconductivity, externally induced magnetic flux lines are treated as existing in a thin layer at the surface of the superconductor, and are attenuated with increasing depth. The present invention does not depend upon the validity of any particular theory of superconductivity, but only upon the recognition that the flux lines do not penetrate throughout the superconductor. The superconductor therefore acts as a barrier to externally produced magnetic fields.

The layer 40 provides an effective barrier against penetration of external magnetic fields to the interior of the enclosure 20. The material of the layer 40 need not carry any substantial amount of electrical current when the enclosure 20 is operated, and in any event has a large area path so that the current density is not large.

For many years, the only known superconducting materials had superconducting transition temperatures $T_c$, above which they were normally conducting and below which they were superconducting, of less than about 30° K., and in most cases less than about 10° K. Such materials are typically cooled to their superconducting states by immersing them in liquid helium or liquid hydrogen, or other liquefied gas having a boiling point near absolute zero. This approach is practical only when the volume to be cooled is relatively small and can be extremely well insulated, as heat leaks result in rapid boiling of the liquid gas coolant. Liquid helium and liquid hydrogen are costly, and it is not feasible to construct a room-size enclosure having a layer of superconducting material with a $T_c$ substantially below 77° K., the boiling point of liquid nitrogen.

More recently, materials have been discovered which have a $T_c$ of greater than 77° K. The presently preferred superconducting material for the layer 40 is of the form $YBa_2Cu_3O_y$, which has a $T_c$ of about 80°–85° K. This superconducting material may be deposited as a thin film on a substrate, as by vapor deposition, the thin film of superconducting material is deposited directly upon the conducting material 38 to form the layer 40 deposited upon, and in intimate contact with, the layer 38. Deposition is accomplishd by electron beam evaporation from metal sources with the target heated to about 400° C. in a partial pressure of oxygen of $10^{-4}-10^{-3}$ Torr. The layer 40 is annealed at 900° C, in oxygen to produce a y value typically of about 4 to 7. The final thickness of the film is about 1 micrometer thick. Other superconducting materials having a $T_c$ greater than about 77° K. are also acceptable.

Figure 4:
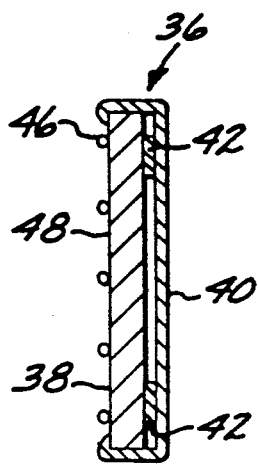
FIG. 4 is the same view of FIG. 3, illustrating an alternative embodiment of the shielding material.

In another embodiment, illustrated in FIG. 4, the layer 40 is formed as a separate structural member and then supported from the structure 30 either directly or through the layer 38, using nonconducting fasteners 42. The embodiment of FIG. 3 has the advantage that prefabricated sections of completed shielding material 36 can first be fabricated, and then later assembled in forming the enclosure 20.

FIGS. 3 and 4 illustrate a preferred form of construction in which the superconducting layer 40 is on the outside of the shielding material 36, but also wrap around the ends of the layer 38, as illustrated at numeral 44. The purpose of the wraparound configuration is to ensure sealing of the joints between panels against leakage of magnetic flux through the joints, when the ends of adjacent panels are butted against each other in construction of the enclosure 20. Magnetic flux does not penetrate narrow cracks having a high aspect ratio (the ratio of the length of the crack to its width), where there is a superconducting layer 40 on each face of the crack. The use of the wraparound configuration and an overlapping configuration in door construction minimizes any such flux leakage of external fields to the interior of the enclosure 20.

In operation of the enclosure 10, the layer 40 must first be cooled to a temperature below its $T_c$, and continuously maintained below $T_c$ during the operation. Inasmuch as the $T_c$ is greater than about 77° K., cooling can be accomplished by cooling the layer 30 with liquid nitrogen. One approach would be to provide a vessel of liquid nitrogen entirely encircling the enclosure 20, but the maintenance of such a large, leak-tight vessel could be difficult.

More preferably, a series of hollow tubes 46 are wound into a serpentine configuration, as in the manner of refrigerator coils, and soldered to an inside surface 48 of the layer 38 of electrically conducting material (that is, the surface to which the layer 40 is not attached), and in good thermal contact with the layer 38. A coolant is passed through the tubes 46, removing heat from the superconducting layer 40 by thermal conduction through the layer 38 and cooling the layer 40 to a temperature below its $T_c$. For example, helium gas can be cooled by expansion through a nozzle in an expansion heat sink 50 and the helium circulated through the tubes 46. The helium gas removes heat from the superconducting layer 40 and is thereby heated. It is then returned to a reservoir in the heat sink 50, recompressed, and recycled through the expansion nozzle and tubes 46. A liquified gas such as liquid nitrogen can be passed through the tubes 46, but the use of an all-gas system is preferred to avoid possible gasification in portions of the tube 46.

In another approach, illustrated in FIG. 5, the layer 40 is cooled by providing a heat sink 52 maintained at a temperature at or below $T_c$ of the material in the layer 40, and thermally connecting the layer 40 to the heat sink 52. Preferably, the heat sink 52 includes a container 54 of a coolant. The coolant is maintained at a temperature below $T_c$ of the superconducting material in the layer 40. A preferred coolant is liquid nitrogen, which has a boiling point of 77° K., is inexpensive, and boils to a harmless gas. Other coolants can be used, as may be required for a particular superconducting material.

Figure 5:
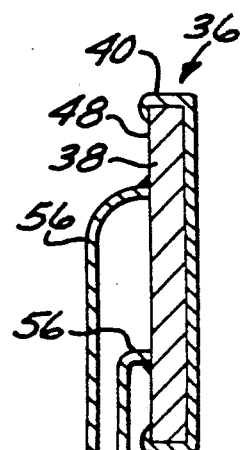
FIG. 5 is the same view as FIG. 3, illustrating an alternative embodiment of the cooling means.

In the embodiment of FIG. 5, wherein the layer 40 is deposited upon the layer 38, the layer 40 is cooled to below its $T_c$ by cooling the layer 38, whereupon the layer 40 is cooled by conduction. The layer 38 is cooled by providing a plurality of heat conductors 56 from the heat sink 52 to various locations of the layer 40. The heat conductor 56 is preferably braided copper wire. One end of the conductor 56 is immersed into the coolant in the heat sink 52, and the other end is attached to the inner surface 48 of the layer 38 by a thermally conducting fastening means. The preferred fastening means is a soldered joint, used with the preferred copper-based conducting material of the layer 38. The copper conductor 56 is readily soldered to the copper layer 38 using conventional low temperature solders such as lead-tin solder.

A plurality of conductors 56 are provided, that extend from the heat sink 52 to different locations on the layer 38, including locations on the side walls, the top and the bottom. Each conductor 56 removes heat from the local region of the layer 38 to which it is attached, thereby also removing heat from the adjacent layer 40.

Figure 8:
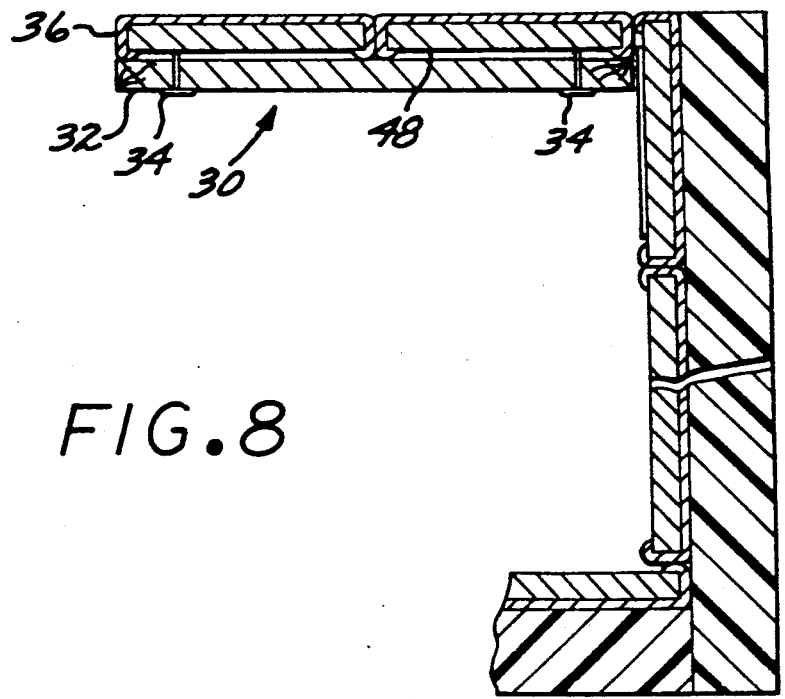
FIG. 8 is the same view as FIG. 2, illustrating an alternative embodiment of the enclosure.

An internal layer 58 and an external layer 60 of insulation are provided on the inside and the outside, respectively, of the shielding material 36. (The internal layer 58 is shown on only a portion of the inside surface in FIGS. 2 and 8, for clarity of illustration, but in fact the internal layer 58 covers all exposed internal surfaces of the shielding material 36.) These layers 58 and 60 reduce heat flow into the layer 40, so that less cooling is required to maintain the layer 40 below its $T_c$. The internal layer 58 is also necessary so that the person 22 is not chilled and made uncomfortable, as this external influence can affect the test results. Optionally, a small heater could be provided within the enclosure 20 to warm the person 22, if necessary. The layers 58 and 60 are preferably foamed polyurethane, in a thickness of about 6 inches each.

Where the superconductor used in the layer 40 has a $T_c$ greater than ambient temperature, the cooling and insulating elements may be omitted, resulting in a structure as shown in FIG. 8. The elements dealing with cooling of the composite materials 36 are omitted, but otherwise the elements are arranged and function as in the corresponding structure described in relation to FIG. 3.

Openings through the walls 26 are necessary to permit the person 22 to enter and leave the enclosure 20, and also to permit electrical signals to be provided to and received form apparatus within the enclosure 20. These openings pose the particular problem that they must be configured to prevent leakage of external magnetic flux into the interior of the enclosure 20.

Figure 6:
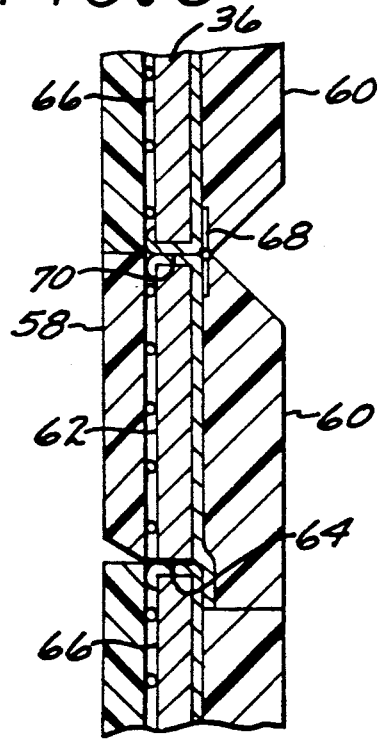
FIG. 6 is a sectional drawing of the door construction of the enclosure of FIG. 1, taken along lines 6—6.

The preferred construction of the door 28 is illustrated in FIG. 6. The door 28 is constructed as a prefabricated panel 62 of the same structure as that illustrated in FIG. 3, with the superconducting layer 40 supported by the electrically conducting layer 38 and having similar wrap-around ends 66 adjacent the end that is hinged. At the other end of the door, which swings open, the superconductivity layer 40 and insulation 60 are configured to overlap the adjacent panel, minimizing flux leakage at this opening. The door 28 is supported to an adjacent fixed panel 66 by hinges 68 in a manner that permits it to swing open but to be closed with its two sides, top, and bottom faces butted against the corresponding portions of the adjacent fixed panel 66. When the door 28 is closed, the width of the opening 70 between the door 28 and the adjacent fixed panel 66 is small, and much less in width than the thickness of the door 28. External magnetic flux lines therefore cannot penetrate through the opening 70.

Figure 7:
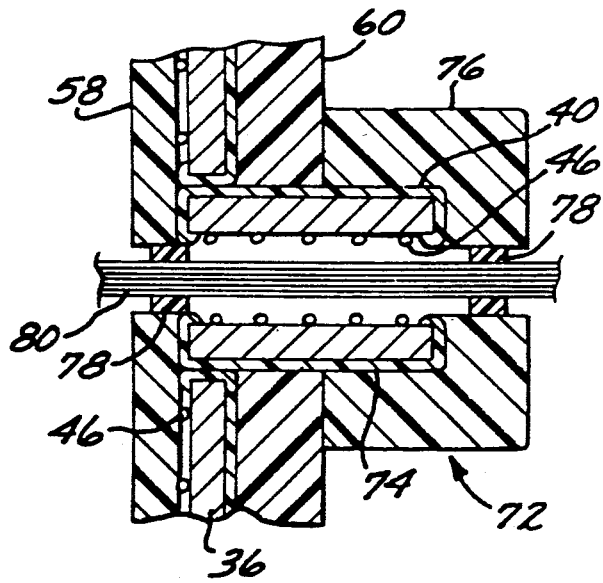
FIG. 7 is a sectional drawing of the feedthrough construction of the enclosure of FIG. 1, taken along lines 7—7.

The preferred construction of an electrical feedthrough 72 is illustrated in FIG. 7. The feedthrough 72 is cylindrical in cross section, with a cylindrical body 74 having an external superconducting layer 40 supported on the conducting layer 38. The superconducting layer 40 is cooled by conduction, as previously described. An external layer of insulation 76 prevents heat leakage outwardly, and insulation plugs 78 at each end of the cylinder prevent heat leakage from the interior of the cylinder. Electrical wires 80 or other continuous elements that must be fed to the interior of the enclosure 20 are passed through the interior of the cylindrical body 74. The cylindrical body 74 is sized so that the length of the cylinder is greater than its diameter. Preferably, the length is at least about 2 times the internal diameter. This configuration prevents external magnetic flux lines from penetrating to the interior of the enclosure 20.

The structure just described is effective at excluding external magnetic flux lines and electrical fields from the interior of the enclosure 20, thereby magnetically isolating the interior of the enclosure 20 from the external environmental fields. The magnetic field within the enclosure 20 is therefore preserved as constant and equal to the field at the time the layer 40 becomes superconducting and flux changes are otherwise prevented, as when the door 26 is closed. However, it may be desirable not only to maintain the magnetic field density as constant, but to maintain it as constant and substantially zero.

The magnetic field can be brought to substantially zero by applying a magnetic cancellation field prior to magnetically isolating the interior of the enclosure 20 from the external environment. To bring the magnetic field within the enclosure 20 to zero, at least one pair of magnetic field cancellation coils 82, termed Helmholts coils, is provided external to the enclosure 20. Normally, the diameter of the Helmholtz coil is at least twice the size of the enclosure 20, so that a generally uniform field can be induced within the enclosure 20. An induced magnetic field within the enclosure 20 is produced by passing an electrical current through the coils 82. This induced magnetic field can be adjusted to exactly balance and counteract, and buck out, the field produced by the external magnetic environment. The balancing is performed when the field within the room can still be changed, that is, before the layer 40 is cooled below its superconducting transition temperature and the door 26 is closed. When this balancing is achieved, the layer 40 is cooled below its superconducting transition temperature and the door 26 is closed, so that the substantially zero magnetic field within the enclosure 20 is thereafter preserved constant at that value. The magnetic cancellation coils 82 can be used to achieve this substantially zero magnetic field over a short time span, but are not sufficiently stable and responsive to permit long term control of magnetic fields, which would make the present enclosure unncessary. Ordinarily, three pairs of magnetic field cancellation coils 82 are provided, with their axes mutually perpendicular, so that external magnetic fields of arbitrary orientation and strength can be nulled.

As of the date of the filing of this application, there is an intense search underway for materials that are superconducting at ambient temperatures (or even at higher temperatures, which includes ambient temperature). Although there are reports that such materials have been discovered, these reports are not fully confirmed. However, because of the trends of recent discoveries, it is believed that such material will be discovered in the future, and the present invention is intended to extend to the use of such materials. The presently preferred embodiment of the invention is therefore the embodiment of FIG. 2, using a superconductor having a $T_c$ above 77° K. but below ambient temperature.

When the preferred for of the enclosure 20 is to be used to reduce the internal electrical and magnetic fields therein, a person 22 is placed within the enclosure 20 and the door 28 closed. A magnetic field meter within the enclosure 20 is observed to determine the magnitude and direction of the field. Currents are passed through the coils 82 so as to induce an opposite magnetic field within the enclosure 20, so that the meter indicates that the magnetic field within the enclosure 20 is brought to substantially zero.

Coolant is run through the tubes 46, and the composite shielding material 36 is gradually cooled as heat is removed into the heat sink 50. Eventually, the temperature of the layer 40 is reduced below the superconducting transition temperature. At that point, changes in external magnetic fields are excluded from the interior of the enclosure 20, so that the interior thereafter remains at a constant magnetic field strength. Since the field was substantially zero as a result of the action of the magnetic cancellation coil 82, that state is preserved constant as long as the material in the layer 40 is maintained in the superconducting state.

Alternatively, the enclosure can be first cooled to superconducting temperature and the interior magnetic field bucked to zero using the cancellation coils 82. The person is placed within the enclosure and the door closed. The field of the cancellation coils is maintained until the door is closed and sealed, resulting in preservation of the zero internal magnetic field.

Figure 9:
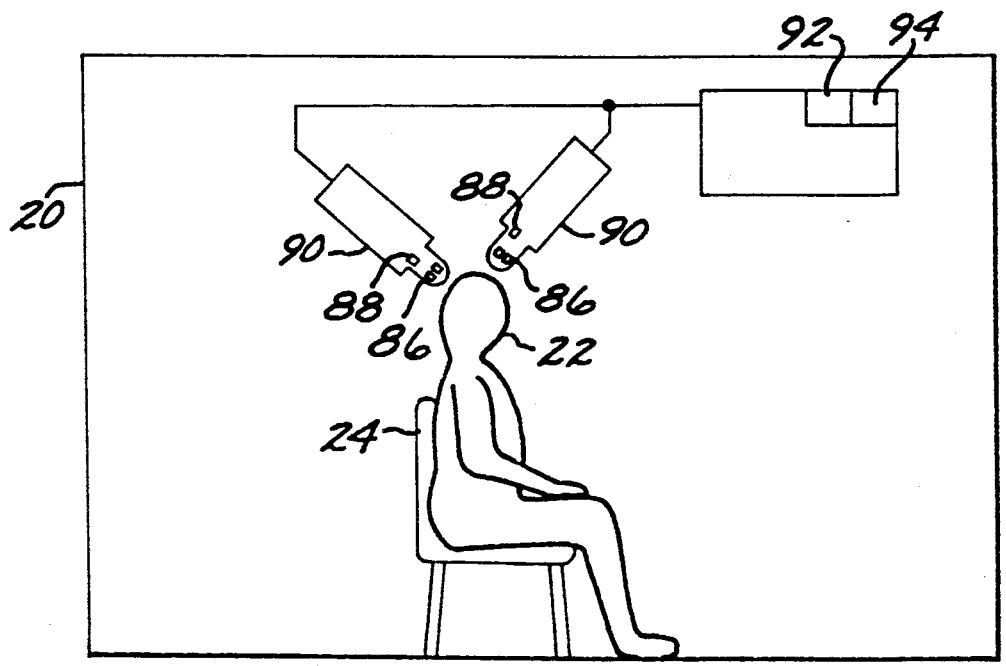
FIG. 9 is a schematic drawing of the biomagnetometer using the enclosure of the invention.

When the enclosure is to be used for measuring biomagnetic fields, means is provided to perform such measurements of the person within the interior of the enclosure. In the preferred approach, illustrated in FIG. 9, a biomagnetometer 84 includes a plurality of magnetic sensing coils 86 for measuring small magnetic fields. The output signal of each magnetic sensing coil 86 is detected by a detector, preferably a superconducting quantum interference device (SQUID) 88. Both the magnetic sensing coil 86 and the SQUID 88 are maintained at a cryogenic operating temperature within a liquid helium dewar 90. (The use of a cryogenic dewar in relation to the biomagnetometer 84 is to be distinguished from the use of reduced temperatures in the region of the shielding material 36. The two are separate components of the system.)

The magnetic signals from the body of the person 22 are picked up by the magnetic sensing coils 86 in the dewar 90, and the signals are detected by the SQUIDs 88. The SQUIDs 88 detect the magnetic field values as electrical currents that are processed in an electronics system 92 and stored in a computer 94 as a function of time, for display and study.

Without the use of a magnetically and electrically shielded enclosure 20, it is difficult to distinguish the magnetic signals produced by the body of the person 22 from the external magnetic and electrical signals of the environment, which are typically over a million times as strong. The enclosure 20 reduces the intensity of the external fields that penetrate into the interior of the enclosure to levels below those produced by the person 22, so that the latter can be much more readily measured.

Thus, the present invention provides an improved enclosure for excluding magnetic and electrical fields therefrom. The enclosure excludes magnetic fields using a layer of a superconducting material, and is substantially less costly and more easily constructed than prior enclosures. Although particular embodiments of the invention has been described in detail for the purposes of illustration, various modifications may be made without departing from the spirit and scope of the invention. Accordingly, the invention is not to be limited except as by the appended claims.

What is claimed is:

1. Apparatus for detection of biomagnetic activity of a person, comprising:
   a magnetically quiet enclosure having therein a level of magnetic noise less than about $10^{-15}$ Gauss/Hertz$^{\frac{1}{2}}$, said enclosure including a shell and a doorway therethrough for admitting a person to the interior of said enclosure, the structure of said enclosure including concentric layers of a thermally and electrically conductive metal and a superconducting material;
   means for cooling the superconducting material to a temperature below its critical temperature; and
   means for performing measurements of biomagnetic activity of a person located within said enclosure.

2. The apparatus of claim 1, wherein said superconducting material is affixed to said conductive metal.

3. The apparatus of claim 1, wherein said superconducting material is an oxide including yttrium, barium, and copper.

4. The apparatus of claim 1, wherein said structure further includes insulation on the surfaces thereof.

5. The apparatus of claim 1, wherein the conductive metal is selected from the group consisting of copper, aluminum, and alloys thereof.

6. The apparatus of claim 1, further including
   means for applying a magnetic field to the interior of said enclosure.

7. Apparatus for use in making magnetic measurements of a person, comprising:
   an enclosure of sufficient size to admit a person to the interior thereof, the walls of said enclosure including a layer of a thermally and electrically conductive metal, and a layer of a superconducting material having a superconducting transition temperature less than ambient temperature but greater than about 77° K.;

means for cooling the superconducting material to a temperature below its critical temperature; and means for internally insulating said enclosure to prevent heat loss from said layer of superconducting material to the interior of said enclosure, so that the interior of said enclosure may be maintained at ambient temperature.

8. The apparatus of claim 7, further including means for externally insulating said enclosure to prevent heat loss from said layer of superconducting material to the exterior of said enclosure.

9. The apparatus of claim 7, wherein said layer of superconducting material is affixed to said layer of conductive metal.

10. The apparatus of claim 7, wherein said superconducting material is an oxide including yttrium, barium, and copper.

11. The apparatus of claim 7, wherein the conductive metal is selected from the group consisting of copper, aluminum, and alloys thereof.

12. The apparatus of claim 7, further including means for applying a magnetic field to the interior of said enclosure.

13. The apparatus of claim 7, further including a door in said enclosure.

14. The apparatus of claim 7, further including an electrical feedthrough in the walls of said enclosure.

* * * * *